(12) United States Patent
Chen et al.

(10) Patent No.: US 7,132,221 B2
(45) Date of Patent: Nov. 7, 2006

(54) METHOD TO PRINT PHOTORESIST LINES WITH NEGATIVE SIDEWALLS

(75) Inventors: Chao-Peng Chen, Fremont, CA (US); Jei-Wei Chang, Cupertino, CA (US); Xiaohong Yang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 502 days.

(21) Appl. No.: 10/660,914

(22) Filed: Sep. 12, 2003

(65) Prior Publication Data
US 2005/0058952 A1    Mar. 17, 2005

(51) Int. Cl.
*G03C 5/00*    (2006.01)

(52) U.S. Cl. .................. 430/296; 430/311; 430/328; 430/330; 430/942

(58) Field of Classification Search ............... 430/296, 430/311, 328, 330, 942
See application file for complete search history.

(56) References Cited

U.S. PATENT DOCUMENTS

| | | | |
|---|---|---|---|
| 4,238,559 A | 12/1980 | Feng et al. | 430/156 |
| 5,310,626 A | 5/1994 | Fernandes et al. | 430/327 |
| 5,725,997 A * | 3/1998 | Kamijima | 430/325 |
| 6,255,035 B1 | 7/2001 | Minter et al. | 430/312 |
| 6,504,675 B1 | 1/2003 | Shukh et al. | 360/125 |

OTHER PUBLICATIONS

*Chemistry of a Chemically Amplified Negative Resist and Process Modification for Electron Beam Exposure*, by Shigeki Yamamoto et al; Presented by Patrick Martons, Sumitomo Chemical America.
*Perpendicular Recording Head Technology*, DASCOM Business Group, TDK Corp., Japan, Jul. 23, 2002, p. 5.
"Bake Condition Effect on Hybrid Lithography Process for Negative Tone Chemically Amplified Resists", by L.Pain et al., Advances in Resist Technology and Processing XVII, Francis M. Houlihan, Editor, Proc. of SPIE, vol. 3999 (2000) ,0277-786 x /00.

\* cited by examiner

*Primary Examiner*—Christopher G. Young
(74) *Attorney, Agent, or Firm*—Saile Ackerman LLC; Stephen B. Ackerman

(57) ABSTRACT

It is very difficult to produce a negative wall angle from either negative or positive-tone chemically amplified resists, especially by e-beam lithography. This problem has now been overcome by first forming a photoresist pedestal in the conventional way, followed by flood exposing with electrons. Then, a second development treatment is given. This results in removal of additional material from the sidewalls, said removal being greatest at the substrate and least at the pedestal's top surface, resulting in negatively sloping sidewalls. Application of this method to a process for forming a pole tip for a vertical magnetic writer is also discussed.

18 Claims, 5 Drawing Sheets

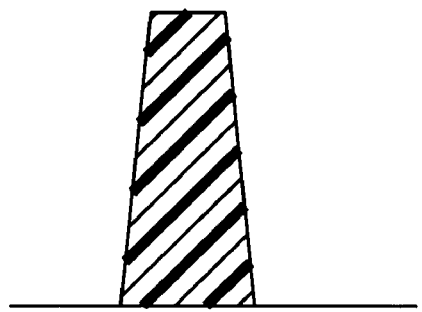
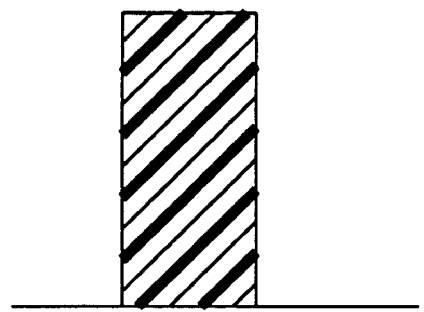
FIG. 1a          FIG. 1b
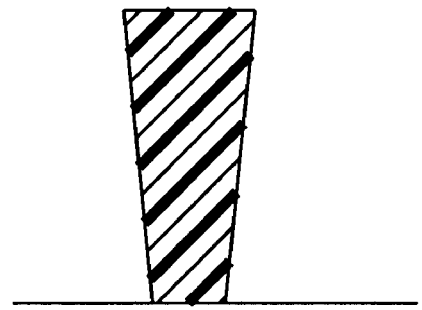
FIG. 1c
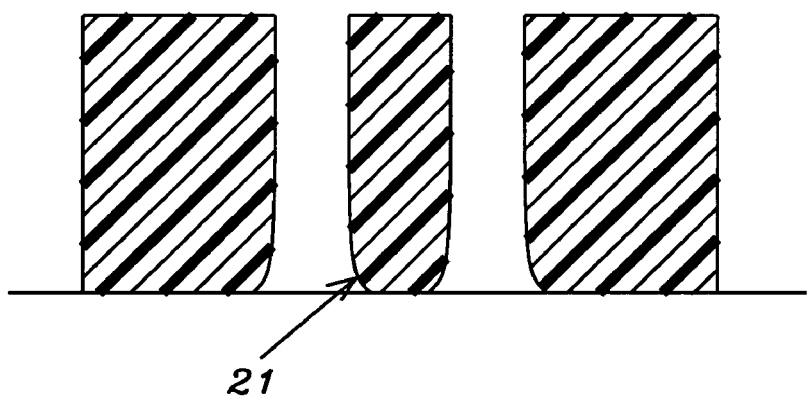
FIG. 2

METHOD TO PRINT PHOTORESIST LINES WITH NEGATIVE SIDEWALLS

FIELD OF THE INVENTION

The invention relates to the general field of electron lithography with particular reference to controlling sidewall slope angle.

BACKGROUND OF THE INVENTION

As the critical dimension for devices drops below 100 nm, the wall angle (slope) of photoresist becomes very critical for subsequent etching, deposition, and lift off processes. The resist wall angle may vary from positive, normal, to negative, as illustrated in FIGS. 1a, 1b and 1c respectively.

Positive and normal sidewall slopes can be easily developed from negative-tone chemically amplified resists. However, it is nearly impossible to produce a negative wall angle from either negative or positive-tone chemically amplified resists, especially by e-beam lithography. Due to electron forward scattering in the resist and backward scattering from the substrate, a positive wall angle is usually formed with negative-tone chemically amplified resists. Positive e-beam resists are unable to produce a consistent wall angle and tend to exhibit resist foot necking such as 21 seen in FIG. 2.

As magnetic recording is pushed to higher areal densities, perpendicular recording has become a serious candidate to replace longitudinal recording. Perpendicular recording uses a magnetic yoke (surrounded by field coil) which terminates as a single pole that is used for the write head. This pole needs to be wide enough at one end to attach to the yoke and narrow enough at its the other end to confine the write flux to a very small area (typically measuring about 0.1 by 0.1 microns). Objects of this type are most easily formed using micro-molding techniques. Since negative resists can be easily applied to create such molds, it is important to be able to control the slope of the sidewalls.

A routine search of the prior art was performed with the following references of interest being found:

U.S. Pat. No. 5,310,626 (Fernandes et al) teaches using a tilt angle in photolithography while U.S. Pat. No. 6,504,675 (Shukh et al) discloses a trapezoidal write pole. In U.S. Pat. No. 6,255,035, Minter et al. describe two photoresist layers exposed to e-beam to form negative resist sidewalls and in U.S. Pat. No. 4,238,559, Feng et al. teach that undercut resist profiles are easily attainable using e-beam lithography.

SUMMARY OF THE INVENTION

It has been an object of at least one embodiment of the present invention to provide a method for forming a photoresist pedestal whose sidewalls slope inwards.

Another object of at least one embodiment of the present invention has been for said method to further allow fine tuning of the exact amount of said negative slope.

Still another object of at least one embodiment of the present invention has been that said method be suitable for use in electron beam lithography.

A further object of at least one embodiment of the present invention has been to provide a process for manufacturing a trapezoidally shaped pole tip for use in a vertical magnetic writer.

These objects have been achieved by first forming a photoresist pedestal in the conventional way. This is followed by flood exposing said pedestal with electrons followed by a second development treatment which results in removal of additional material from the sidewalls, said removal being greatest at the substrate and least at the pedestal's top surface, resulting in negatively sloping sidewalls. Additionally, an application of this method to a process for forming a pole tip for a vertical magnetic writer is also described.

BRIEF DESCRIPTION OF THE DRAWINGS

FIGS. 1a, 1b, and 1c illustrate three possible types of sidewall in pedestals formed from photoresist.

FIG. 2 illustrates a particular problem associated with sidewalls when using positive e-beam resists.

DESCRIPTION OF THE PREFERRED EMBODIMENTS

Figure 3:
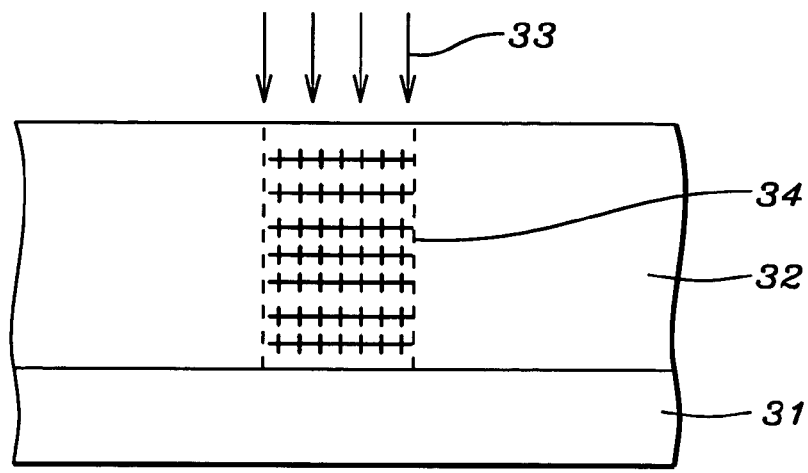
FIG. 3 shows formation of a latent image in photoresist after exposure to a patterning electron beam.
Figure 4:
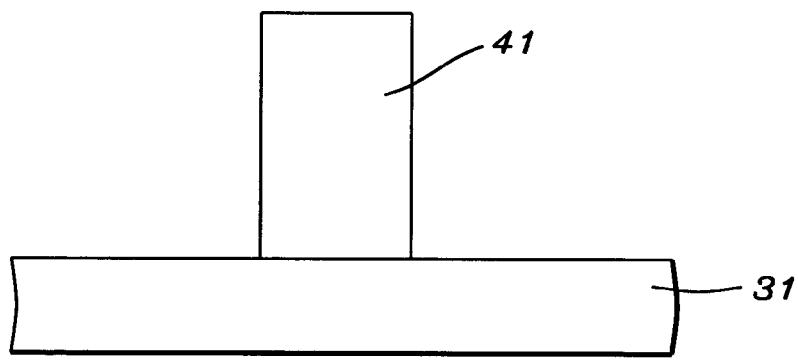
FIG. 4 shows a photoresist pedestal of the prior art.

Referring now to FIG. 3, the method of the present invention begins with the deposition of layer of photoresist 32 on substrate 31. For photoresist we have preferred to use 2000 Å of NEB22A2 (a negative tone chemically amplified resist from Sumitomo Chemical). The photoresist is then exposed to pattern generating electron beam 33 (electron dose of between about 10 and 40 $\mu C/cm^2$, with about 23 $\mu C/cm^2$ being preferred), thereby forming in the photoresist latent image 34 in the shape of a rectangular prism. This is followed by a baking treatment (heating to a temperature between about 80 and 120° C. for between about 1 and 4 minutes, with about 100° C. for 2 minutes being preferred) which in turn is followed by a first development treatment (immersion in a TMAH solution having a concentration between about 1 and 3% for between about 10 and 60 seconds, with about 1.79% TMAH for 13 seconds being preferred), selected for the achievement of optimum resolution. This results in the formation of photoresist pedestal 41, as seen in FIG. 4.

Figure 5:
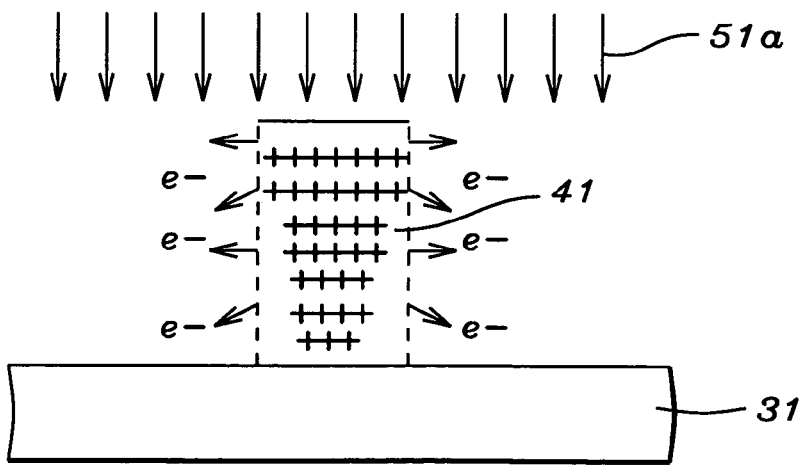
FIG. 5 illustrates a key feature of the present invention which is used to adjust the slope of the sidewalls.

Now follows a key feature of the invention. As shown in FIG. 5, pedestal 41 is exposed to flooded electron beam 51a. The latter is generated by raster and/or vector scan. In a first embodiment of the invention, flooded beam 51a is vertically applied to provide an electron dose of between about 10 and 40 $\mu C/cm^2$, with about 26 $\mu C/cm^2$ being preferred. Some electrons, when bombarding the resist, will escape from the resist sidewall but fewer electrons will travel all the way to the bottom. Consequently, more acid will be released from the top and the center of the resist pedestal than from the bottom, resulting in a higher degree of cross-linking closer to the top and further from the bottom. Therefore, the lower sections of the resist pedestal have the potential to be preferentially dissolved in a suitable solvent.

Figure 6:
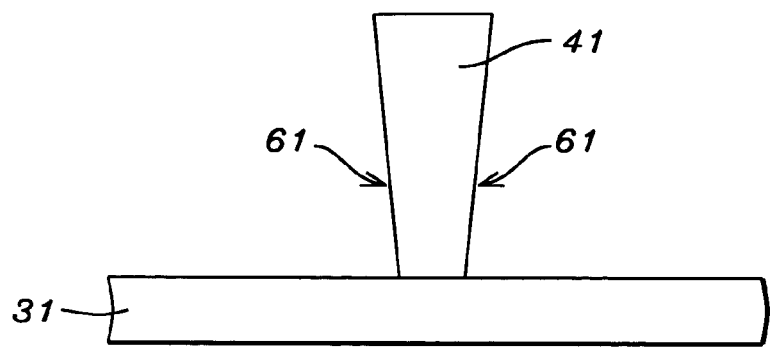
FIG. 6 shows how a pedestal having negatively sloping sidewalls may be formed.

Accordingly, a second baking treatment (heating to a temperature between about 80 and 120° C. for up to 5 minutes, with about 100° C. for 2 minutes being preferred)

is given, followed by a second development treatment, a key feature being that a more concentrated developer is used this time (immersion in a TMAH solution having a concentration between about 1 and 3% for between about 10 and 60 seconds, with about 2.38% TMAH for 60 seconds being preferred), causing sidewalls 61 to slope inwards (at an angle of between about 45 and 90 degrees from vertical) so that the pedestal is widest at its top surface and narrowest at the substrate. This is illustrated in FIG. 6.

Figure 7:
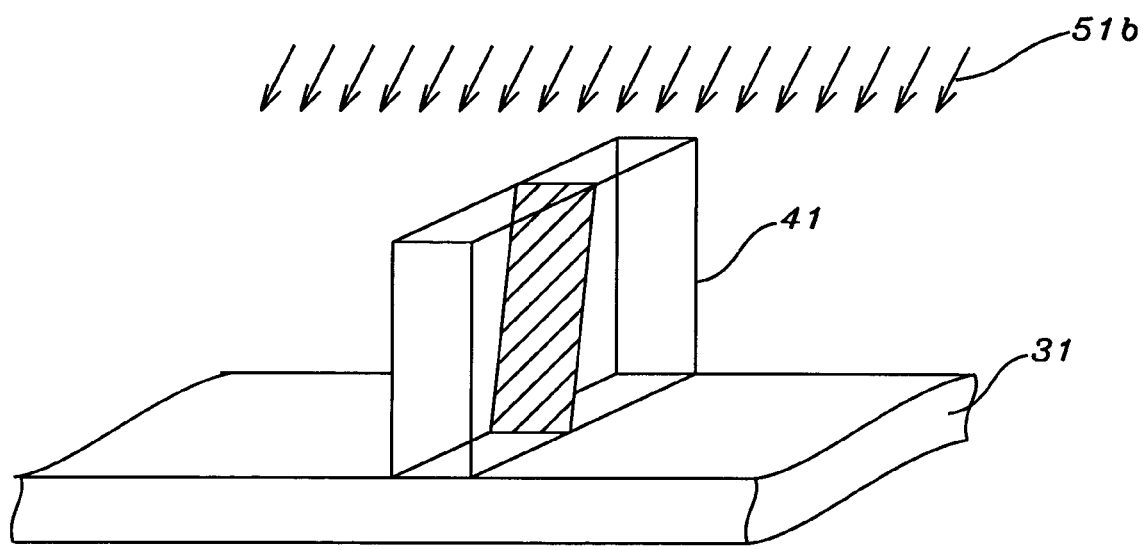
FIG. 7 shows how sidewall slope may be fine tuned.
Figure 8:
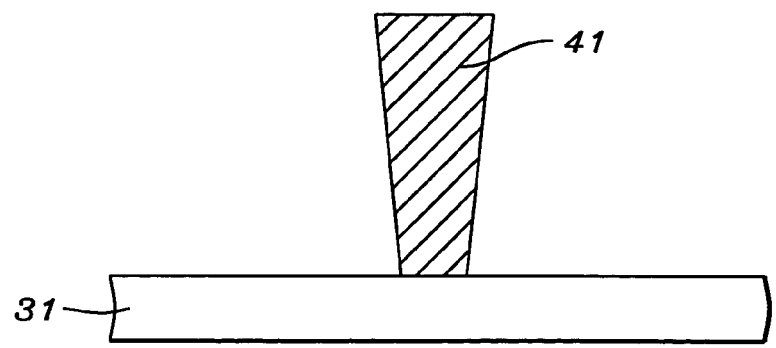
FIG. 8 is the starting point for a process to form a magnetic write pole.

In a second embodiment of the invention, the flooded electron beam is applied at an angle relative to the vertical. This is illustrated as beam 51b in FIG. 7. Angular exposure of this type leads to a longer traveling path for electrons to escape from the resist sidewall. This, in turn, magnifies the difference in the degree of cross-linking between the top and the bottom sections of the resist pedestal, forming a more negatively sloping sidewall as illustrated in FIG. 8.

An important advantage of the second embodiment is that it enables the extent of negative sidewall slope to be tunable—the greater the beam tilt, the more negative the sidewall slope.

We have applied the above method to the development of a process for manufacturing a trapezoid-shaped write pole for the use in perpendicular magnetic recording. This process begins with the formation of a photoresist pedestal with negatively sloping sidewalls as just described above and shown as trapezoidal pedestal 41 in FIG. 8. Typically, this layer of photoresist is deposited to a thickness between about 0.1 and 0.3 microns.

Figure 9:
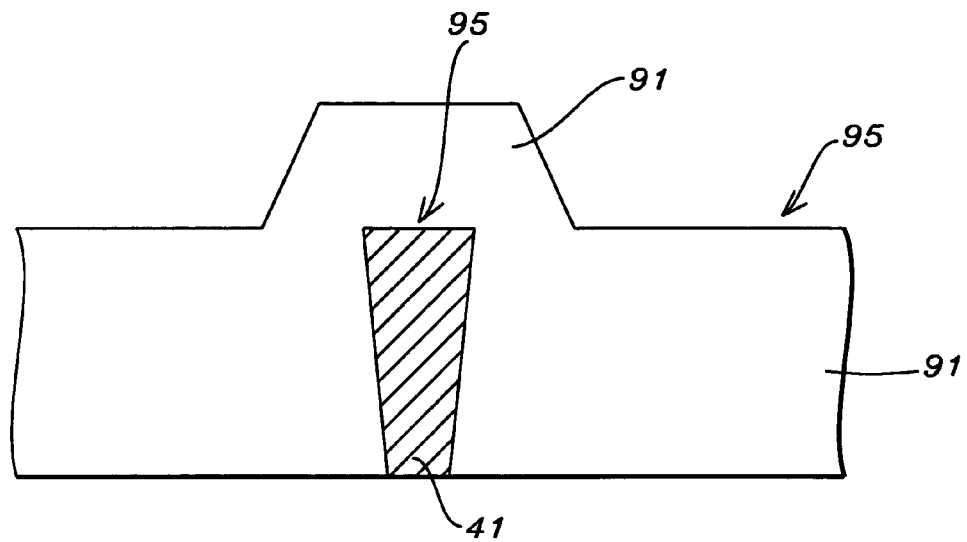
FIGS. 9–12 show how a suitable mold for said write pole is formed.
Figure 10:
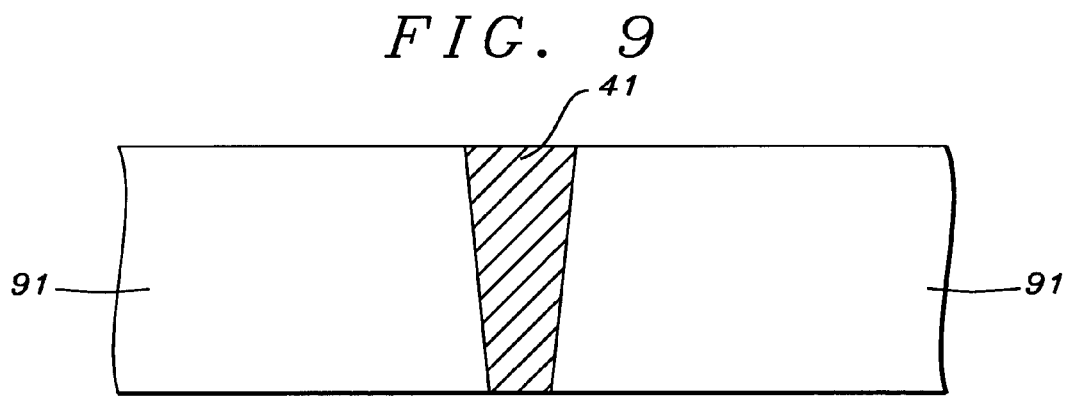
Figure 11:
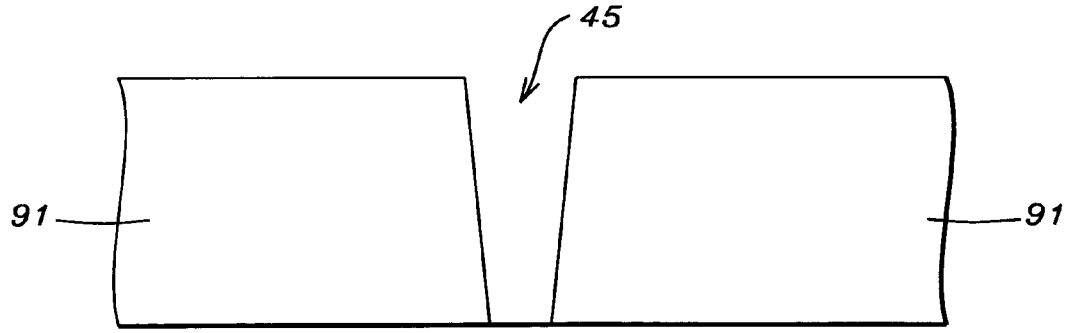
Figure 12:
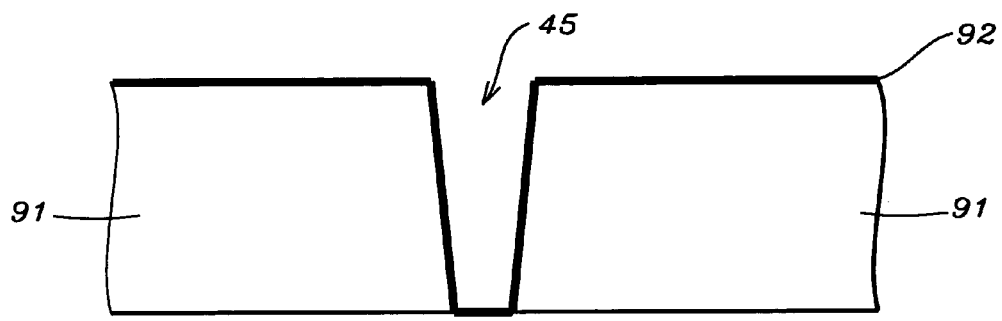
Figure 13:
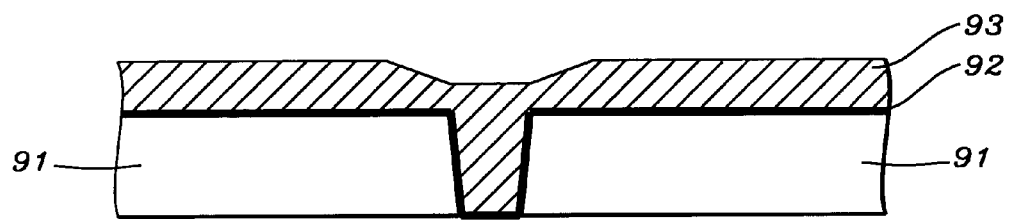
FIGS. 13–14 illustrate how the write pole is formed in the mold.
Figure 14:
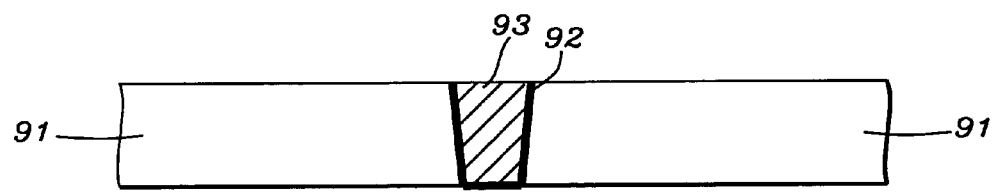

A conformal coating of non-magnetic material 91 (such as aluminum oxide or silicon oxide) is then deposited to a thickness that is sufficient to fully enclose said trapezoidal prism (typically between about 0.1 and 0.3 microns) as shown in FIG. 9. The preferred deposition method of this step is atomic-layer chemical vapor deposition which is a process of depositing successive layers of very thin films, each of which is allowed to react with an appropriate gas before the latter is removed and a fresh thin film layer deposited. The method provides high purity fims having well controlled stoichiometry. This is then planarized until top surface 95 of prism 41 is just exposed, as shown in FIG. 10, followed by the removal of all photoresist thereby forming mold 45, as seen in FIG. 11, All exposed surfaces, including mold 45, are then coated with seed layer 92, as seen in FIG. 12. Examples of materials suitable for the seed layer include, but are not limited to, CoNiFe, NiFe, CoFe, and CoFeN, and it is deposited to a thickness between about 100 and 500 Angstroms. This is followed by deposition, onto the seed layer, of layer 93 of a material having high magnetic permeability, to a thickness sufficient to overfill the mold, as seen in FIG. 13. Suitable materials for layer 93 include, but are not limited to, CoNiFe, NiFe, and CoFe, all of them having a saturation moment of at least 2.1 Tesla (or 21 kG).

The process concludes with planarizing until seed layer 92 has been just removed (except inside the mold itself), resulting in the formation of write pole 93.

The invention claimed is:

1. A method to form a photoresist pedestal having inwardly sloping sidewalls, comprising:
    depositing a layer of photoresist, having a top surface, on a substrate;
    exposing said layer of photoresist to an electron beam pattern, thereby forming in the photoresist a latent image of a rectangular prism;
    subjecting the photoresist to a first baking treatment followed by a first development treatment, thereby forming a pedestal having vertical sidewalls;
    exposing said pedestal to a vertically applied flooded electron beam whereby an amount of acid is released from said sidewalls, said amount being greatest near said top surface and lowest near said substrate; and
    then subjecting said photoresist pedestal to a second baking treatment followed by a second development treatment, whereby said sidewalls slope inwards and the pedestal is widest at said top surface and narrowest at said substrate.

2. The method described in claim 1 wherein said photoresist is a negative tone chemically amplified resist.

3. The method described in claim 1 wherein said the step of exposing said layer of photoresist to an electron beam pattern causes the photoresist to be exposed to an electron dose of between about 10 and 40 $\mu C/cm^2$.

4. The method described in claim 1 wherein said first baking treatment further comprises heating to a temperature between about 80 and 120° C. for between about 1 and 4 minutes.

5. The method described in claim 1 wherein said first development treatment further comprises immersing in a TMAH solution having a concentration between about 1 and 3% for between about 10 and 60 seconds, thereby achieving optimum resolution.

6. The method described in claim 1 wherein said the step of exposing said layer of photoresist to a flooded electron beam causes the photoresist to be exposed to an electron dose of between about 10 and 40 $\mu C/cm^2$.

7. The method described in claim 1 wherein said second baking treatment further comprises heating to a temperature between about 80 and 120° C. for up to about 5 minutes.

8. The method described in claim 1 wherein said second development treatment further comprises immersing in a TMAH solution having a concentration between about 1 and 3% for between about 10 and 60 seconds.

9. The method described in claim 1 wherein said sidewalls slope inwards at an angle of up to about 60 degrees from vertical.

10. A method to form a photoresist pedestal having inwardly sloping sidewalls, comprising:
    depositing a layer of photoresist, having a top surface, on a substrate;
    exposing said layer of photoresist to an electron beam pattern, thereby forming in the photoresist a latent image of a rectangular prism;
    subjecting the photoresist to a first baking treatment followed by a first development treatment, thereby forming a pedestal having vertical sidewalls;
    exposing said pedestal to a flooded electron beam that is applied at an angle relative to vertical; and
    then subjecting said photoresist pedestal to a second baking treatment followed by a second development treatment, whereby said sidewalls slope inwards by an amount so that the pedestal is widest at said top surface and narrowest at said substrate.

11. The method described in claim 10 wherein said angle at which said flooded electron beam is applied is used as a means to control said amount that said sidewalls slope inwards.

12. The method described in claim 10 wherein said photoresist is a negative tone chemically amplified resist.

13. The method described in claim 10 wherein said the step of exposing said layer of photoresist to an electron beam pattern causes the photoresist to be exposed to an electron dose of between about 10 and 40 µC/cm².

14. The method described in claim 10 wherein said first baking treatment further comprises heating to a temperature between about 80 and 120° C. for between about 1 and 4 minutes.

15. The method described in claim 10 wherein said first development treatment further comprises immersing in a TMAH solution having a concentration between about 1 and 3% for between about 10 and 60 seconds, thereby achieving optimum resolution.

16. The method described in claim 10 wherein said the step of exposing said layer of photoresist to a flooded electron beam causes the photoresist to be exposed to an electron dose of between about 10 and 40 µC/cm².

17. The method described in claim 10 wherein said second baking treatment further comprises heating to a temperature between about 80 and 120° C. for up to about 5 minutes.

18. The method described in claim 10 wherein said second development treatment further comprises immersing in a TMAH solution having a concentration between about 1 and 3% for between about 10 and 60 seconds.

* * * * *